United States Patent [19]

Hechtman et al.

[11] Patent Number: 4,778,635
[45] Date of Patent: Oct. 18, 1988

[54] METHOD AND APPARATUS FOR FABRICATING ANISOTROPICALLY CONDUCTIVE MATERIAL

[75] Inventors: Charles D. Hechtman, Hopewell, N.J.; Victor J. Velasco, Madrid, Spain

[73] Assignee: American Telephone and Telegraph Company, New York, N.Y.

[21] Appl. No.: 98,241

[22] Filed: Sep. 18, 1987

[51] Int. Cl.⁴ .......................... B29C 39/10; H01F 7/02
[52] U.S. Cl. ........................................ 264/24; 29/877; 29/883; 264/108; 264/272.11; 264/272.13; 264/279.1; 335/296; 335/297; 335/298; 335/299; 335/303; 335/306; 425/3; 425/DIG. 33; 439/586
[58] Field of Search ............ 264/24, 104, 108, 272.11, 264/272.13, 279.1, 40.1; 425/3, 446, DIG. 33; 29/877, 883; 148/108; 335/288, 289, 296, 297, 298, 299, 303, 306; 439/586; 522/71, 148

[56] References Cited

U.S. PATENT DOCUMENTS

| | | |
|---|---|---|
| 3,117,065 | 1/1964 | Wooten . |
| 3,127,544 | 3/1964 | Blume, Jr. ................. 335/296 X |
| 3,128,544 | 4/1964 | Allingham ................ 264/24 X |
| 4,209,481 | 6/1980 | Kashiro et al. ............. 264/24 |
| 4,292,261 | 9/1981 | Kotani et al. .............. 264/24 |

FOREIGN PATENT DOCUMENTS 55-159578 12/1980 Japan .
58-152033 9/1983 Japan .

Primary Examiner—Jeffery Thurlow
Assistant Examiner—Leo B. Tentoni
Attorney, Agent, or Firm—Robert B. Levy

[57] ABSTRACT

A sheet (10) of anisotropically conductive material may be fabricated by mixing a quantity of electrically conductive, ferromagnetic particles (16), typically spheres, in an uncured polymer (12). The polymer is then cured in a magnetic field which causes the particles to align in chains (14) each parallel to the lines of the field. In accordance with the invention, a spatially varying magnetic field, comprised of first and second substantially uniformly spaced regions (22 and 24) of high and low field strength, respectively, is applied to the polymer (12) during curing. The difference in the strength of the magnetic field in the first and second regions is such as to give rise to a lateral force on the particles which urges them into the first regions of high field strength where the particles align into chains. Since the first regions of high field strength are substantially uniformly spaced, the chains of particles in the polymer will be likewise substantially uniformly spaced.

5 Claims, 2 Drawing Sheets

METHOD AND APPARATUS FOR FABRICATING ANISOTROPICALLY CONDUCTIVE MATERIAL

TECHNICAL FIELD

This invention relates to a method and apparatus for fabricating a sheet of anisotropically conductive material which exhibits a high electrical conductivity through its thickness (z direction) and a high electrical resistance through its plane (x-y direction).

BACKGROUND ART

Anisotropically conductive materials are typically comprised of an insulative medium having a plurality of spaced-apart, electrically conductive paths extending therethrough along a first direction so that materials exhibit a high conductivity along the first direction, and a high electrical resistance along all other directions. Typically, the electrically conductive paths in most anisotropically conductive materials extend parallel to the z or thickness direction of the material. Thus, such anisotropically conductive materials exhibit a preferential conductivity along their thickness and a high electrical resistance laterally through the x-y plane of the material.

A common use of anisotropically conductive materials is to electrically connect a pair of devices, each having an array of opposed, spaced-apart contacts lying in a separate one of a pair of parallel, spaced-apart planes. To connect the two devices, the anisotropically conductive material is sandwiched therebetween so a separate one of the conductive paths through the material extends between a separate one of the contacts on each device. Since the conductive paths in the anisotropically conductive material are laterally separated from each other by an insulative medium, a connection between one and only one contact on the pair of devices is provided by the anisotropically conductive material. Undesirable cross-connections between two or more contacts on the same device are thus avoided.

An early proposal for fabricating a sheet of anisotropically conductive material, having a preferential conductivity along its thickness direction, is disclosed in U.S. Pat. No. 4,209,481, issued June 24, 1980. In accordance with the teachings of that patent, a quantity of electrically conductive, ferromagnetic wires, each of a length at least as great as the desired thickness of the sheet, is mixed in a liquid insulative polymer, such as silicone rubber. The polymer is spread into a sheet which is then cured (permitted to vulcanize or dolidify) in the presence of a magnetic field whose lines of force are parallel to the thickness direction of the sheet. When subjected to the magnetic field, the wires experience a magnetic force which causes them to rotate and align themselves in bundles parallel with the lines of the field. The bundles of wires extend between the opposed major surfaces of the polymer sheet so as to provide a conductive path therebetween.

As taught in the aforementioned patent, the magnetic field applied to the polymer varies spatially, that is, the field is comprised of alternating regions of high and low field strength which are spatially periodic. In other words, each region of high and low field strength is separated from a region of like field strength by a uniform distance or pitch. It is believed that the reason for employing a spatially varying field is to avoid the problem of the wires becoming entangled with each other as they align with the lines of the field. As the wires in the polymer align themselves with the field, more energy is stored in the regions of high strength than in the regions of low field strength. In this type of physical system, the wires in the magnetic field always seek to increase the energy of the system. Hence, the wires in the polymer will gather in the regions of high field strength. By making the spacing between adjacent regions of the same strength greater than the length of the wires, the wires will separate a sufficient distance to avoid entangling with each other as they align with the lines of the magnetic field.

A disadvantage associated with fabricating a sheet of anisotropically conductive material in this fashion is that the spacing between adjacent bundles of wires is always greater than the length of the wires, and hence the thickness of the sheet. The ability of a sheet of anisotropically conductive material produced in the above manner to provide a one-to-one electrical connection between the contacts on two devices becomes limited as the spacig between the contacts on each device becomes smaller. Currently, the trend in the electronics industry is towards producing smaller devices which have more closely spaced contacts. Thus it is necessary for the lateral spacing between the conductive paths in the anisotropically conductive polymer to be very small if the material is interconnect devices having very closely spaced leads.

A more recent proposal for fabricating a sheet of anisotropically conductive material is to mix a plurality of electrically conductive, ferromagnetic spheres, each typically of a diameter much less than that of the desired sheet thickness, in an insulative polymer. The sphere-filled polymer is spread in a sheet which is cured in a magnetic field whose lines are parallel to the thickness direction of the sheet. When subjected to the magnetic field, the spheres align themselves contiguous with each other in chains because in such a configuration, the energy stored in the field reaches a local maximum value.

The advantage obtained in using spheres is that they do not tangle with each other as they align in chains parallel to the lines of the field. As a result, there is no need to employ a spatially varying field having alternating, uniformly spaced regions of high and low field strength in order to cure a sphere-filled polymer, in contrast to the wire-filled polymer. Rather, a spatially uniform field is employed to cure the sphere-filled polymer because the spheres tend to laterally separate to a lesser extent in such a field as they would in a spatially varying field. The smaller the extent of the lateral separation between the spheres, the smaller the lateral spacing between the chains of spheres. Thus, curing the sphere-filled polymer in a spatially uniform field may result in a smaller lateral spacing between the chains of spheres which is desirable.

One of the difficulties incurred with curing the sphere-filled polymer in a spatially uniform magnetic field is that the lateral spacing between the chains of spheres cannot be well controlled. Typically, the chains of spheres are randomly located. When using the sphere-filled, anisotropically conductive material to interconnect two devices, each having closely spaced contacts, the random spacing between the chains of spheres may result in one of the contacts on a device not being in contact with a chain of spheres. As a result, one or more of the contacts on each device may not be connected to a corresponding contact on the other device through a conductive path in the sheet of anisotropically conductive material.

BRIEF SUMMARY OF THE INVENTION

Briefly, the foregoing disadvantages are overcome by the method of the present invention for fabricating a sheet of anisotropically conductive material having a plurality of substantially uniformly spaced chains of conductive particles extending substantially therethrough. The method is initiated by mixing a quantity of electrically conductive, ferromagnetic spheres in an uncured, nonconductive polymer. The polymer is then spread into a sheet which is cured in a spatially varying magnetic field having alternating, substantially uniformly spaced regions of high and low field strength. When the spatially varying field is applied to the polymer sheet, the spheres mixed in the polymer sheet tend to move into and gather within the regions of high field strength. As the spheres gather in each region of high field strength, they align themselves contiguous with each other in one or more chains, each parallel to the lines of the magnetic field. Since the regions of high field strength are substantially uniformly spaced apart, the chains of spheres will likewise be substantially uniformly spaced apart. By adjusting the lateral spacing between the regions of high field strength, the lateral spacing between the chains of spheres can be well controlled. In particular, the spacing between the chains can be made to correspond to the close spacing between the contacts of different electrical devices.

In accordance with another aspect of the present invention, the spatially varying field applied to the polymer sheet during the curing thereof is adjusted such that the spheres in each chain remain unsaturated. By adjusting the field so the spheres in each chain remain unsaturated, the relative force exerted by a chain on an unattached sphere adjacent thereto will be greater than if the spheres in the chain were saturated. In this way, the probability that a sphere adjacent to the chain will attach itself thereto is increased.

DETAILED DESCRIPTION

Figure 1:
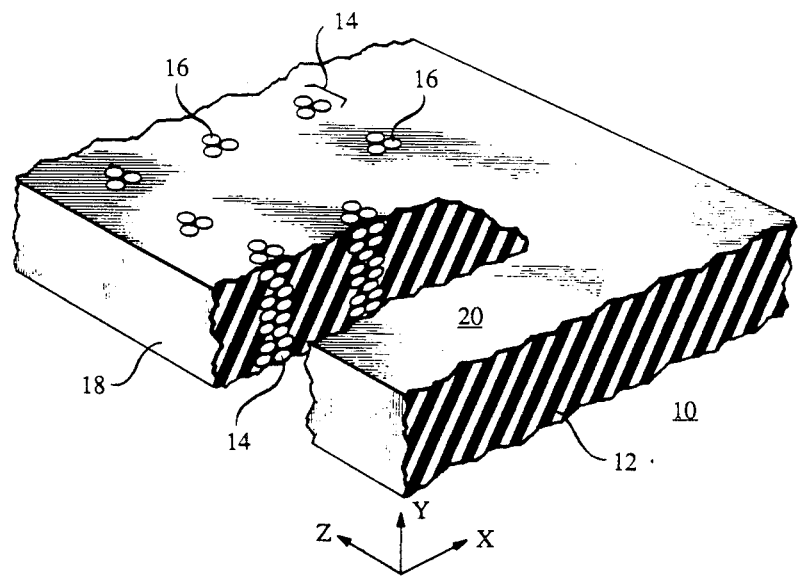
FIG. 1 is a partially cut-away, perspective view of a prior art sheet 10 of anisotropically conductive material.

FIG. 1 is a partially cut-away, perspective view of a prior art sheet 10 of anisotropically conductive material of a thickness d. The sheet 10 is comprised of an electrically insulative polymer 12 (e.g., silicone rubber) having a plurality of laterally spaced chains 14 of contiguous, electrically conductive spheres 16, each chain extending through the sheet parallel to its thickness (z direction). A portion of the sphere 16 at each end of each chain 14 is proximate to a separate one of the major surfaces 18 and 20 of the sheet 10 for making electrical contact with a member (not shown) such as an electrical lead or contact. Since the polymer 12 itself is nonconductive, the only electrically conductive paths through the sheet 10 are those provided by the chains 14 of spheres 16. As may be appreciated, the chains 14 render the sheet 10 anisotropically conductive, with the preferential conductivity being in the thickness direction of the sheet.

The sheet 10 is commonly fabricated by mixing the spheres 16 which are of a diameter <d in the polymer 12 while the polymer is in an uncured or liquid state. Typically, the spheres 16 are fabricated from a metal, such as iron or nickel, or some alloy thereof, which is both electrically conductive an ferromagnetic. The ferromagnetic property of the spheres 16 allows them to be aligned in the chains 14 when a magnetic field is applied to the polymer 12 during the curing thereof. In the past, a spatially uniform magnetic field has been employed to align the spheres 16 into the chains 14, with the attendant disadvantage that it has been extremely difficult to obtain chains which are laterally spaced a uniform distance apart.

Figure 2:
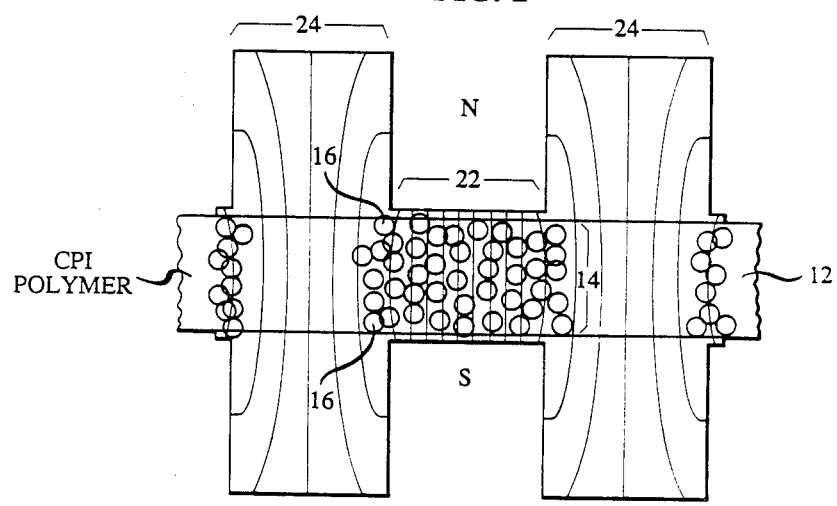
FIG. 2 is a cross-sectional view of the sheet of FIG. 1 during the curing thereof in a spatially varying magnetic field.

Referring to FIG. 2, a substantially uniform spacing between the chains 14 in the sheet 10 can be obtained, in accordance with the present invention, by curing the polymer sheet 10 in a spatially varying magnetic field whose lines of force are parallel to the desired direction of preferential conductivity. Such a spatially varying magnetic field is represented in FIG. 2 by a plurality of alternating, uniformly spaced regions 22 and 24 of high and low field magnetic strength.

As the polymer sheet 10 is cured within the spatially varying magnetic field, the spheres 16 in the polymer sheet seek to reach a higher energy state. The reason for this is that the spheres 16 within the magnetic field represent a physical system which tends toward a state in which the energy level is increased. Since the field strength in the regions 22 is greater than in the regions 24, it follows that more energy will be stored in the regions of high field strength. Hence, the spheres 16 in the polymer sheet migrate from the regions 24 of low field strength into the regions 22 of high field strength. The fact that there is a migration of the spheres 16 into the regions 22 of high field strength implies that there must be a lateral force on the spheres resulting from the difference in the strength of the fields in the regions 22 and 24, which is exactly the case.

The spheres 16 which gather in the regions 22 of high field strength align themselves contiguous with each other in the chains 14 which are each parallel to the lines of the field. The reason the spheres 16 align themselves in this fashion is that the energy of the spheres is at local maximum in such a configuration. As indicated previously, it is the chains 14 extending through the polymer sheet 10 that afford it a preferential conductivity.

The advantage obtained by curing the polymer sheet 10 in the spatially varying magnetic field shown in FIG. 2 is that the chains 14 are formed exclusively in the regions 22 of high field strength where the spheres 16 are forced to gather. In contrast, were the polymer sheet 10 to be cured in a uniform magnetic field, the chains 14 would be randomly located because of the absence of any lateral force on the spheres 16 owing to the lack of any spatial variation in the field strength. As may be appreciated, since the regions 22 of high field strength are substantially uniformly spaced, the chains 14 of spheres 16 which are formed in such regions are likewise uniformly spaced. By controlling the lateral spacing between the regions 22 of high magnetic field strength, the lateral spacing between the chains 14 can be well controlled. When the spacing between the regions 22 of high field strength is made very small, the resultant sheet 10 of anisotropically conductive material will have very closely spaced chains 16, making the material useful as a connector for devices having very closely spaced leads.

Figure 3:
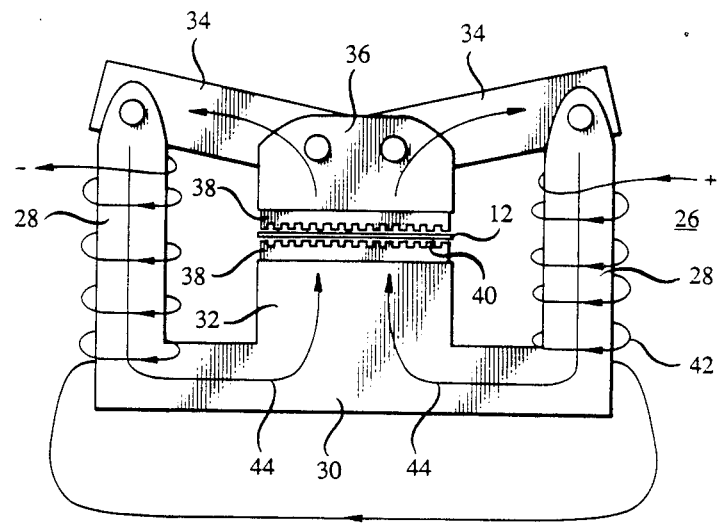
FIG. 3 is a side view of an electromagnet in accordance with the present invention for applying a spatially varying magnetic field to the sheet of FIGS. 1 and 2.

Referring to FIG. 3, there is shown a generally "W"-shaped electromagnet 26 for generating a spatially varying magnetic field such as shown in FIG. 2. The electromagnet 26 is fabricated from a ferromagnetic metal or alloy and is comprised of a pair of spaced outer legs 28, integral with, and rising upwardly from the ends of a base member 30. A middle leg 32 is also integral with, and rises upwardly from the base member 30 at a point midway between the outer legs 28. The middle leg 32 is somewhat shorter than the outer legs 28 but has a cross section twice as large. In practice, the cross section of the middle leg 32 is typically sized on the order of the area of the polymer sheet 10 which is to be cured in the spatially varying field produced by the electromagnet 26.

Figure 4:
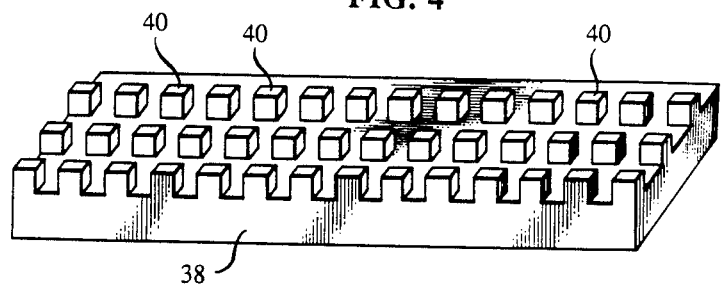
FIG. 4 is an enlarged perspective view of a portion of a pole piece on the apparatus of FIG. 3.

Each of the outer legs 28 has its upper end pivotally connected to a first end of a separate one of a pair of arms 34 of equal length. The arms 34 each have a second end pivotally connected to a block 36 to allow the block to be raised from and lowered towards the middle leg 32. The opposing surfaces on the middle leg 32 and the block 36 are made flat for mounting a separate one of a pair of pole pieces 38, each identical in construction. Referring now to FIG. 4, each pole piece 38 is comprised of a ferromagnetic member (e.g., iron) having a plurality of uniformly spaced mesas 40 projecting therefrom. As seen in FIG. 3, the pole pieces 38 are mounted so that the mesas 40 on the pole pieces are directly opposite each other. When the polymer sheet 10 is to be cured, it is placed between the pole pieces 38 so that the mesas 40 on each pole piece will be separated from those on the other pole piece by the thickness of the sheet.

Each of the two outer legs 32 has a wire coil 42 wound thereabout in the same direction as the wire wound around the other leg. The wire coils 42 are coupled in series with each other and are energized from a variable voltage dc power supply 44. When the coils 42 are energized from the power supply 44, the coils generate an electromagnetic field whose lines are collectively represented by the arrows 44. As may be appreciated from FIG. 3, the lines 44 of the magnetic field generaged by the coils 42 pass upwardly through the middle leg 32 and into the block 36. Thus, the pole pieces 38 mounted to the middle leg 32 and to the block 36 each serve as north and south magnetic poles, respectively.

The electromagnetic field, which is generated when the windings 42 are energized, is stronger in the regions directly between the mesas 40 on the two pole pieces 38 than in the regions laterally adjacent to the mesas. This is because the gap between the pole pieces 38, which exists by virtue of the polymer sheet 10 being interposed therebetween, is smaller in the regions between the mesas 40 than in the regions adjacent to the mesas. The smaller the gap, the greater the strength of the magnetic field. As may be appreciated, the resultant magnetic field which is produced by the electromagnet 26 thus has a plurality of first and second spatially separated regions of high and low field strength, respectively, the first region lying between the mesas 40 and the seond region lying adjacent to the mesas, respectively. The first and second regions of high and low field strength within the magnetic field produced by the electromagnet 26 correspond to the regions 22 and 24, respectively, described with respect to FIG. 2. Thus, by controlling the spacing between the mesas 40, the pitch or periodicity of the field produced by the electromagnet 26 is controlled.

When the polymer sheet 10 in FIG. 1 is cured within the magnetic field produced between the pole pieces 38, the chains 14 of spheres 16 that form are located in the regions between the mesas 40, rather than in the regions adjacent thereto. This is because the spatial variation in the strength of the field produced by the electromagnet 26 causes the spheres 16 to gather in the first regions of high field strength, that is, the regions directly between the mesas 40. Thus, by controlling the number of, and the spacing between, the mesas 40 on the pole pieces 38, the number of, and lateral spacing between, the chains 14 in the sheet 10 can be well controlled. One way in which a large number of very finely spaced mesas 40 may be obtained in each pole piece 38 is to etch the pole pieces by well-known photolithographic techniques.

When curing the polymer sheet 10 in the electromagnet 26, it is desirable to adjust the power supply 44 to control the excitation supplied to the coils 42 to control the strength of the magnetic field applied to the polymer. By controlling the strength of the magnetic field, the propensity of the spheres 16 to attach to an existing one of the chains 14 can be controlled. To understand how the propensity of one of the spheres 16 to attach to an existing one of the chains 14 can be controlled, it is first necessary to understand the phenomenon of saturation in a ferromagnetic material.

A ferromagnetic material, such as a sphere 16, for example, when placed in a magnetic field, becomes saturated when there is no appreciable increase in the magnetic density within the material notwithstanding an increase in the magnetic excitation, that is, the strength of the field. The magnetic density within each sphere 16 is proportional to the magnetic force exerted thereby on another sphere. Thus, when the spheres 16 within each chain 14 are saturated, the force exerted by the chain on a non-attached sphere adjacent thereto increases linearly with the strength of the field. However, if the spheres 16 in each chain 14 remain unsaturated, then as the field strength increases, the force exerted by the chain on an unattached sphere increases quadratically. Thus, the propensity that an unattached sphere 16 will attach itself to the chain 14 increases.

Figure 5:
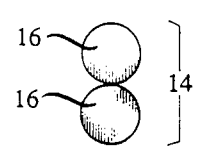
FIG. 5 is a side view of a chain of two vertically aligned spheres within the sheet of FIG. 1.

The propensity of an unattached sphere 16 to attach itself to a chain 14 in both the saturated and unsaturated state can be evaluated in terms of the energy stored in the chain which is a measure of the magnetic force exerted thereby. To simplify the analysis, we assume the chain 14 is comprised of only two vertically aligned spheres 16 as shown in FIG. 5. For the chain 14 shown in FIG. 5, the energy stored therein, as a consequence of work expended during alignment of the spheres 16, will, for the unsaturated state, be given by $$U_u = \frac{(NI)^2}{2(R_1 \| R_2)} \tag{1}$$

where

NI is the excitation (voltage) applied to the coils 42;
R$_1$ and R$_2$ are reluctance values calculated from a flux vs. excitation model for a sphere in a gap; and
the term R$_1$ || R$_2$ is defined as $$\frac{R_1 R_2}{R_1 + R_2}$$

Figure 6:
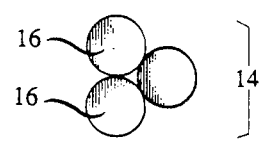
FIG. 6 is a side view of a chain of two vertically aligned spheres, as shown in FIG. 5, with an additional sphere attached to the side thereof.

When a sphere 16 becomes attached to the chain 14 as shown in FIG. 6, the total energy stored in the chain in the unsaturated state will be given by $$U_u = \frac{2(NI)^2}{3(R_1 \| R_2)} \quad (2)$$

In the unsaturated state, the energy difference $\Delta U_u$ for the chains 14 of FIGS. 5 and 6 will be given by the difference between equations (1) and (2).

$$\Delta U_u = \frac{(NI)^2}{\frac{3}{2} R_1 \| R_2} - \frac{(NI)^2}{2 R_1 \| R_2} = \frac{(NI)^2}{6 R_1 \| R_2} \quad (3)$$

Saturation of the chain 14 of FIG. 5 occurs when the excitation NI applied to the coils 42 of FIG. 3 is raised to a value NI'. The chain 14 of FIG. 6 becomes saturated when the excitation NI is raised to NI'', a quantity somewhat less than NI'. The difference $\Delta U_s$ in the energy stored in the columns 14 of FIGS. 5 and 6, when each is saturated, will be given by $$\Delta U_s = NI \left( \frac{NI''}{\frac{3}{2}(R_1 \| R_2)} + \frac{NI - NI''}{R_1 + \frac{1}{2}(R_1 \| R_2)} - \frac{NI'}{2(R_1 \| R_2)} - \frac{(NI - NI')}{2R_1} \right) \quad (4)$$

The effect of saturation can be observed by calculating the ratio $\Delta U_s$ to $\Delta U_u$ which is given by $$\frac{\Delta U_s}{\Delta U_u} = \frac{3(2R_1 + R_2) R_2}{(2R_1 + 3R_2)(R_1 + R_2)} - \frac{3R_1 R_2 NI'}{(2R_1 + 3R_2)(R_1 + R_2)NI} \quad (5)$$

Equation (5) can be simplified because $R_1 \gg R_2$, yielding $$\frac{\Delta U_s}{\Delta U_u} = \frac{3R_2}{R_1} \left(1 - \frac{NI'}{2 NI}\right) \quad (6)$$

As may be appreciated from equation (6), the ratio of the energy difference is always less than unity and has a minimum value at the edge of saturation where NI=NI'. Since the energy ratio given by equation (6) is less than unity, it follows that the magnetic force exerted by a chain 14 that is not saturated will thus dominate the force exerted by a chain that is saturated.

From this knowledge, it is desirable to force the spheres 16 in the polymer sheet 10 to remain unsaturated if the spheres are to attach themselves to a preexisting chain 14, especially under the circumstances where it is desired to form such chains under a series of salient poles, such as the mesas 40 of FIGS. 3 and 4. Conversely, in the event that chains 14 of spheres 16 are to be produce in a polymer sheet 10 cured in a spatially uniform magnetic field (not shown), then the spheres should be saturated to reduce the propensity of the spheres to attach to an existing chain.

It is to be understood that the above-described embodiments are merely illustrative of the principles of the present invention. Various modifications and changes may be made by persons skilled in the art which will embody the principles of the invention and fall within the spirit and scope thereof. For example, the present invention is directed to a method for aligning ferromagnetic spheres in an uncured polymer. However, the technique is equally useful for aligning ferromagnetic particles having other geometries, provided the particles have all of their dimensions less than the thickenss of the material and that the aspect or width-to-height ratio thereof is on the order of unity so as to avoid the problem of the particles becoming entangled with each other when they align themselves with the lines of the magnetic field. Further, while the technique of the instant invention has been described with respect to fabricating a sheet of anisotropically conductive material, slabs or blocks of such material may also be fabricated, provided the strength of the magnetic field is sufficient to align the particles therein.

What is claimed is:

1. A method for fabricating an anisotropically cnductive material having a preferential conductivity along a first direction comprising the steps of;
   (a) mixing a plurality of electrically conductive, ferromagnetic particles in an uncured, insulative polymer; and
   (b) curing the polymer in the presence of a magnetic field whose lines of force are parallel to the desired direction of preferential conductivity so that the particles mixed in the polymer align themselves with one another in one or more chains which are each parallel to the lines of magnetic field, characterized in that;
   the strength of the magnetic field is adjusted to increase or decrease the propensity of the particles, which have not yet become part of any chain, to attach themselves thereto.

2. The method according to claim 1, characterized in that the strength of the magnetic field is adjusted to saturate the chains of particles to reduce the propensity of the particles which have not yet become part of any chain to attach themselves thereto.

3. The method according to claim 1, characterized in that the strength of the magnetic field is adjusted so that the chains of particles remain unsaturated to increase the propensity of the particles, which have not yet become part of any chain, to attach themselves thereto.

4. The method according to claim 1, characterized in that the magnetic field in which the polymer is cured varies spatially such that there are alternating, substantially uniformly spaced first and second regions of high and lwo field strength, respectively, the difference in the strength of the field in the first and second regions being such to give rise to a lateral force on the particles which urges them into the first regions of high field strength where the particles align themselves into the chains parallel to the lines of the field.

5. Apparatus for applying a magnetic field to an uncured polymer, containing a plurality of electrically conductive, ferromagnetic particles therein, to align the particles into chains parallel to the lines of the field characterized by:
- a "W"-shaped frame including a base, a pair of outer legs each extending upwardly from the base so as to be substantially parallel to and spaced from each other, and a middle leg integral with and extending upwardly from the base at a point midway between the two outer legs, the middle leg having a substantially flat surface at its end distant from the base;
- a pair of members each having a first end pivotally connected to the end of a separate one of the outer legs;
- a block pivotally connected to a second end of each of said memebers so as to be movable to and from the middle leg, the block having a substantially flat surface thereon opposite to the substantially flat surface on the middle leg;
- a pair of ferromagnetic pole pieces each having a plurality of uniformly spaced mesas protruding therefrom, the pole pieces being mounted to the flat surfaces on the middle leg and the block, respectively, so that the mesas on the pole pieces oppose each other;
- a pair of coils of wire, each wrapped about a separate one of the outer legs and coupled in series with each other; and
- an adjustable dc voltage source for energizing the coils.

* * * * *